United States Patent
Gehman et al.

(10) Patent No.: US 7,479,407 B2
(45) Date of Patent: Jan. 20, 2009

(54) DIGITAL AND RF SYSTEM AND METHOD THEREFOR

(75) Inventors: John Gehman, Austin, TX (US); Brian H. Christensen, Oestervraa (DK); James H. Kleffner, Leander, TX (US); Addi B. Mistry, Austin, TX (US); David Patten, Austin, TX (US); John Rohde, Ega (DK); Daryl Wilde, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 742 days.

(21) Appl. No.: 10/302,130

(22) Filed: Nov. 22, 2002

(65) Prior Publication Data

US 2004/0195591 A1    Oct. 7, 2004

(51) Int. Cl.
 *H01L 21/00* (2006.01)
(52) U.S. Cl. .................. 438/109; 438/106; 438/107; 438/108; 438/125; 438/126; 438/127; 257/659; 257/660; 257/678; 257/685; 257/686; 257/723; 257/734; 257/738; 257/777; 257/787; 257/E23.001; 257/E23.114; 257/E23.116
(58) Field of Classification Search ............... None
See application file for complete search history.

(56) References Cited

U.S. PATENT DOCUMENTS

| | | | |
|---|---|---|---|
| 4,339,628 A * | 7/1982 | Marcantonio et al. | 174/372 |
| 5,694,300 A * | 12/1997 | Mattei et al. | 361/818 |
| 5,903,049 A * | 5/1999 | Mori | 257/686 |
| 6,294,838 B1 | 9/2001 | Peng | |
| 6,414,384 B1 * | 7/2002 | Lo et al. | 257/685 |
| 6,437,449 B1 * | 8/2002 | Foster | 257/777 |
| 6,593,647 B2 * | 7/2003 | Ichikawa | 257/686 |
| 6,593,662 B1 * | 7/2003 | Pu et al. | 257/777 |
| 6,627,990 B1 * | 9/2003 | Shim et al. | 257/712 |
| 6,737,750 B1 * | 5/2004 | Hoffman et al. | 257/777 |
| 6,818,978 B1 * | 11/2004 | Fan | 257/686 |
| 6,919,631 B1 * | 7/2005 | Hoffman et al. | 257/707 |
| 6,972,481 B2 * | 12/2005 | Karnezos | 257/686 |
| 7,023,079 B2 * | 4/2006 | Wang et al. | 257/686 |

(Continued)

OTHER PUBLICATIONS

PCT/US 03/30797 International Search Report.

*Primary Examiner*—Andy Huynh
*Assistant Examiner*—Hoang-Quan T Ho
(74) *Attorney, Agent, or Firm*—James L. Clingan, Jr.; Joanna G. Chiu

(57) ABSTRACT

A stacked die system (10) has a first die (16) having a first surface with active circuitry, a second die (18) having a first surface with active circuitry, and a conductive shield (28) interposed between the first surface of the first die and the first surface of the second die. In one embodiment, the distance between the first surfaces of the first and second die is less than one millimeter. The stacked die system may also include a package substrate (12) where the active circuitry of the first and second die are electrically connected to the package substrate. The electrical connections may be formed using wire bonds (56, 58, 60, 62). Alternatively, the first die may be connected to the package substrate in a flip chip configuration. In one embodiment, the active circuitry of the first die generates RF signals where the shield helps protect the RF signals from interference caused by the active circuitry of the second die.

5 Claims, 2 Drawing Sheets

U.S. PATENT DOCUMENTS

| | | | |
|---|---|---|---|
| 7,205,651 B2 * | 4/2007 | Do et al. | 257/706 |
| 2002/0079568 A1 * | 6/2002 | Degani et al. | 257/686 |
| 2002/0171136 A1 * | 11/2002 | Hiraoka et al. | 257/684 |
| 2003/0178715 A1 * | 9/2003 | Sturcken et al. | 257/686 |
| 2004/0183180 A1 * | 9/2004 | Chung et al. | 257/686 |

* cited by examiner

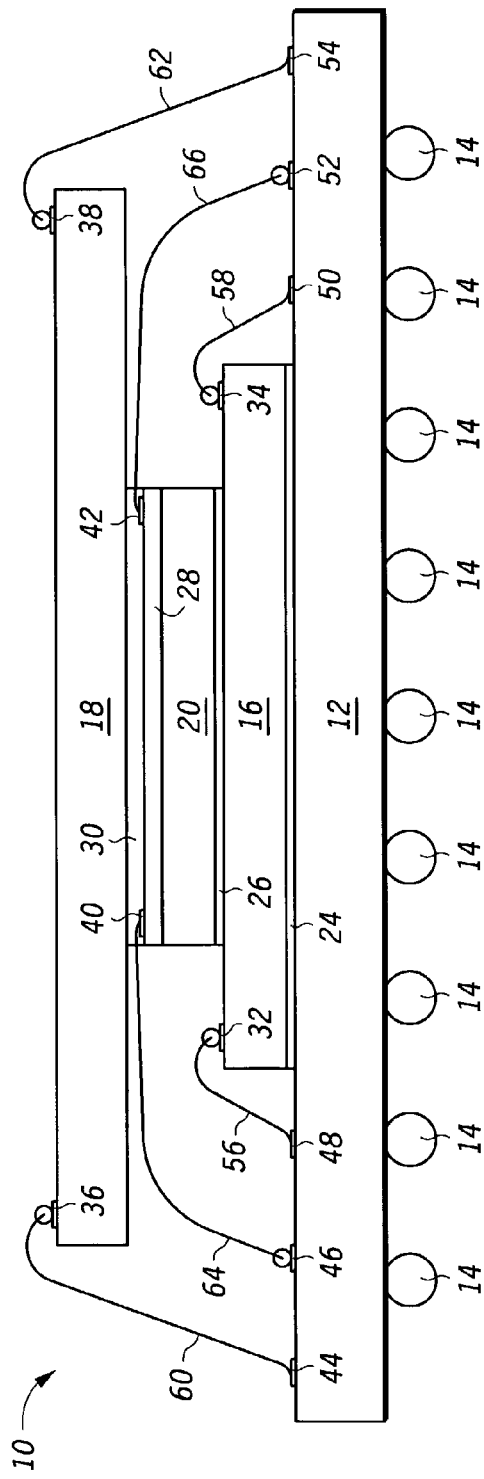
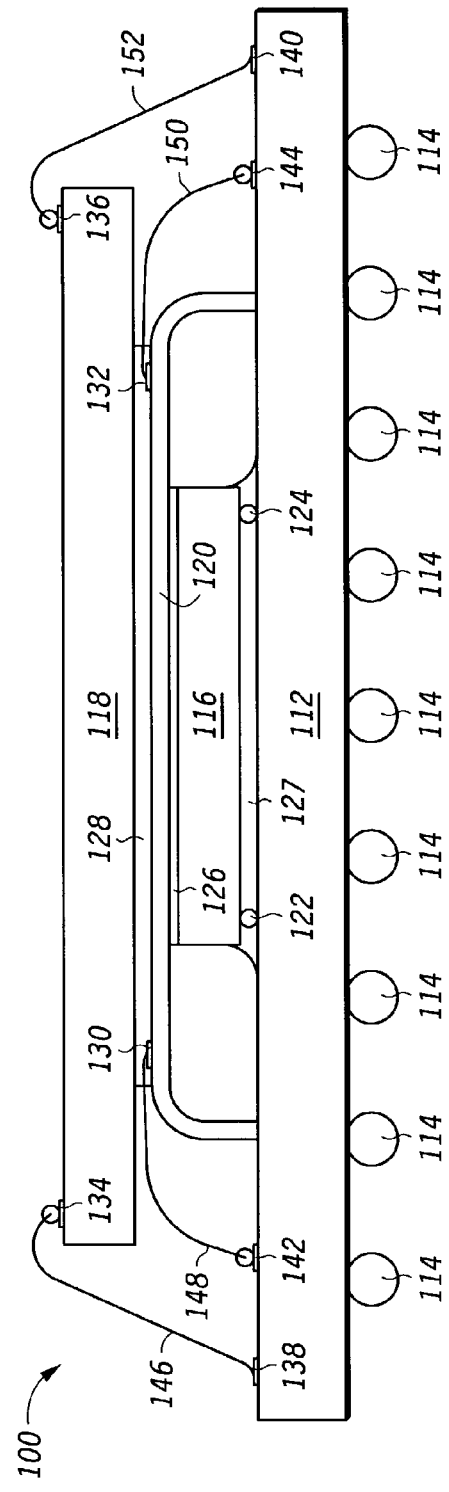

DIGITAL AND RF SYSTEM AND METHOD THEREFOR

FIELD OF THE INVENTION

The invention relates to systems requiring multiple functions, and more particularly to systems that perform digital processing and RF signal processing.

RELATED ART

Many applications exist that require both digital processing and RF signal processing. Examples include cell phones, personal area network (PAN) systems, wireless local area network (WLAN) systems. One of the improvements continuously sought by manufactures of these system is the overall package volume of the semiconductors that perform the RF and digital functions. This can provide a cost savings in the manufacture of the final product that is sold to the end user because the system can be made smaller and it can also improvement marketability because the system is smaller and lighter. One approach to this is to provide a single integrated circuit with both the digital and RF functions present. Complicating this is that improvements in semiconductor processing do not necessarily effect the digital and the RF aspects the same. The RF circuits are generally best if they include bipolar transistors whereas the digital circuits are typically best if they are completely MOS. Further, processes for optimizing RF performance may be in conflict with processes for optimizing digital performance. Another potential adverse effect is that the required RF processes unnecessarily complicate the processes used in the manufacture of the digital circuits.

BRIEF DESCRIPTION OF THE DRAWINGS

The present invention is illustrated by way of example and not limited by the accompanying figures, in which like references indicate similar elements, and in which:

FIG. 1 is a cross section of a stacked die system according to an embodiment of the invention;

FIG. 2 is a cross section of a stacked die system according to another embodiment of the invention;

Figure 3:
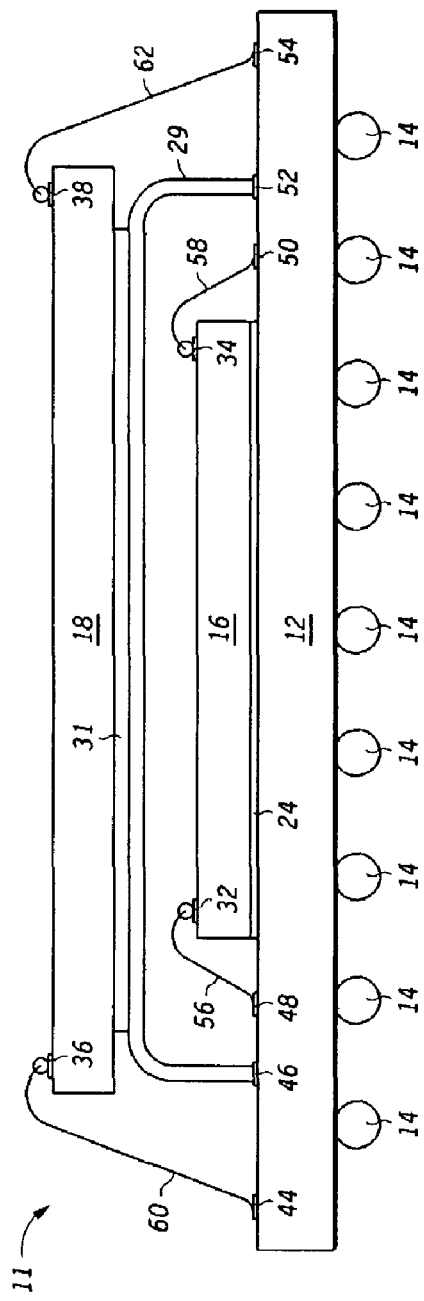
FIG. 3 is a cross section of a stacked die system according to yet another embodiment of the invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

A stacked die system in one embodiment of the invention has a die stack having a first die and a second die that have their active surfaces in close proximity and having a conductive shield present in the stack between the two die. This shield aids in allowing both die to be present in the same, relatively small package while protecting one die from high frequency effects generated by the other. This and other aspects are better understood with reference to the drawings and the following description.

Shown in FIG. 1 is a stacked die system 10 comprising a package substrate 12 having a bottom surface and a top surface, a plurality of solder balls 14 on the bottom surface of package substrate 12, a RF die 16 over the top surface of package substrate 12 and physically attached to package substrate 12 with a layer 24 that is conventionally used for attaching a die to a package substrate, a digital die 18 over RF die 16, a shield 28 between RF die 16 and digital die 18, a spacer 20 between shield 28 and RF die 16, an adhesion layer 26 between RF die 16 and spacer 20, and an adhesion layer 30 between shield 28 and digital die 18. The RF die 16 has a bond pad 32 and a bond pad 34 on a top surface of RF die 16. Digital die 18 has a bond pad 36 and a bond pad 38 on a top surface of digital die 18. Digital die 18 and RF die 16 each have many more bond pads, but only two are shown in this cross sectional view. Substrate 12 has bond pads 44, 46, 48, 50, 52, and 54 on the top surface thereof and has many additional ones not shown in this cross section. The bond pads on the top surface are connected to the exemplary solder balls 14 on the bottom by traces on the top and bottom surfaces and through the package substrate 12. Shield 28 has a bond pad 40 and a bond pad 42 on a top surface thereof. Shield 28 is parallel to the top surfaces of RF die 16 and digital die 18. The various bond pads are wire bonded together as follows: bond pad 36 to bond pad 44 by wire 60, bond pad 40 to bond pad 46 by wire 64, bond pad 32 to bond pad 48 by wire 56, bond pad 34 to bond pad 50 by wire 58, bond pad 42 to bond pad 52 by wire 66, and bond pad 38 to bond pad 54 by wire 62. This wire bonding is achieved using conventional wire bonding equipment. Wires 64 and 66 are wired bonded using a technique known as reverse stitching. The ball that is typically formed at one end is thus not between shield 28 and digital die 18.

In one example, substrate 12 has a thickness of 0.38 millimeter (mm). RF die 16 has a thickness of 0.18 mm. Digital die 18 has a thickness of 0.18 mm. Spacer 20 has a thickness of 0.18 mm. Shield 30 has a thickness of 0.6 microns. Adhesion layer 26 has a thickness of 25 microns. Adhesion layer 30 has a thickness of 50 microns. Shield 30 is aluminum. Spacer 20 is monocrystalline silicon. Adhesion layers 26 and 30 are epoxy resin that have spherical fillers. Such an epoxy resin is well known to one of ordinary skill in the art. Other conductive materials, especially metals, can be used for shield 28. Aluminum has the benefit of being easily bonded by conventional wire bonding equipment. Copper, for example, could also be used but would likely require some type of plating for wire bonding. Other insulating materials, especially adhesive polymers, may also be used for spacer 20. Shield 28 and spacer 20 are singulated from a wafer that is silicon with an aluminum coating, which are commercially available. RF die 16 is attached to substrate 12 in the conventional manner of die attach. Similarly, spacer 20, which has attached to it shield 28, is adhered to RF die 16 also using conventional die attach equipment in the manner of performing die attach which inherently causes the formation of adhesion layer 26. Also similarly, digital die 18 is attached to shield 28 using conventional die attach equipment in the manner of performing die attach which inherently causes the formation of adhesion layer 30. Adhesion layer 30 is made about twice as thick as is most commonly used for die attach. The reason for the increased thickness is to provide additional separation between digital die 18 and shield 28 in order to protect the wire bonds 40 and 42 and wires 64 and 66 from digital die 18.

Digital die 18 has circuitry for performing digital functions and thus has fast switching speeds. The high speed switching generates high frequency noise. In this case, the active circuitry for performing these digital functions is present on the top surface. RF die 16 is for generating and receiving RF signals and the active circuitry for performing this RF generation function is present on the top surface. Such RF signal processing typically includes tuning circuits. One such example is a voltage controlled oscillator (VCO). Because of the objective of generating RF signals, the tuning circuits that are being used for this purpose are sensitive to high frequency noise. Thus, digital die 18, in operation, will be a source of high frequency noise that is detrimental to RF die 16 in operation. Shield 28 and spacer 20 alleviate this problem for stacked die system 10. In the absence of shield 28 and spacer 20, digital die 18 would have to be significantly further apart. This problem is relatively minor if there is sufficient distance between the noise source and the active circuitry of the RF die but providing sufficient distance is costly in terms of package height. The distance between the regions of active circuitry, in the absence of a shield and spacer such as shield 28 and spacer 20, was found to be sufficient if it was 1 mm. The distance of 1 mm, however, would make a stacked die system too high. The actual distance will vary based on the strength of the noise that is generated and the sensitivity of the RF circuit that is being protected.

Spacer 20 is to space the active circuitry of RF die 16 from shield 28. Two potential effects of shield 28 on RF die 16 is added capacitance that can effect the tuning of the circuits that use inductors and/or capacitors for such tuning and the reradiation of RF signals back due to shield 28 not being a perfect conductor and not being perfectly grounded. Shield 28 is grounded through wires 64 and 66, however, such wires have some impedance. Shield 28 itself also has some impedance. The thickness of spacer 20 and shield 28 combined is significantly less than the thickness required if distance alone was being used to overcome the problem of high frequency noise generated by digital die 18 disturbing RF die 16.

Shown in FIG. 2 is a stacked die system 100 comprising a package substrate 112 having a bottom surface and a top surface, a plurality of solder balls 114 on the bottom surface of package substrate 112, a RF die 116 over the top surface of package substrate 112, a digital die 118 over RF die 116, a shield 120 between RF die 116 and digital die 118, an adhesion layer 126 between RF die 116 and shield 120, a non-conductive underfill 127 between RF die 116 and substrate 112, and an adhesion layer 128 between shield 120 and digital die 118. The RF die 116 has conductive bumps 122 and 124 on a bottom surface of RF die 116. RF die 116 has many more conductive bumps than just the two shown in this cross sectional view. Digital die 118 has a bond pad 134 and a bond pad 136 on a top surface of digital die 118. Digital die 118 has many more bond pads than just the two shown in this cross sectional view. Substrate 112 has bond pads 138, 142, 144, and 140 on the top surface thereof and many others not shown. Substrate 112 connects the bond pads on its top surface to the solder balls 114, as well as others not shown, on the bottom surface. Shield 120 has a bond pads 130 and 132 on a top surface thereof. The various bond pads are wired bonded together as follows: bond pad 134 to bond pad 138 by wire 146, bond pad 130 to bond pad 142 by wire 148, bond pad 132 to bond pad 144 by wire 150, and bond pad 136 to bond pad 140 by wire 152. With these wire bond connections, the active circuitry of RF die 16 and digital die 18 are connected to package substrate 12 and ultimately solder balls such as solder balls 14. This wire bonding is achieved using conventional wire bonding equipment. Wires 148 and 150 are wired bonded using a technique known as reverse stitching.

Stacked die system 100 is similar to stacked die system 10 shown in FIG. 1. One significant difference is that shield 120 extends past edges of RF die 116 and then extends down to make contact with package substrate 112. This shield 120 is shown as being contacted by a wire 150, but contact may also be directly connected from shield 120 to package substrate by using conductive paste. One benefit of this shield 120 is that mechanical support is provided to digital die 118 past the edges of RF die 116. In such case the thickness is about 100 microns in order to provide this mechanical support. Different thicknesses may also be effective. A shield in the configuration of shield 120 is preferably copper but may be other conductive materials as well. Another benefit is that electrical shielding extends along the edges of RF die 116. Shield 120 is preformed prior to being applied on top of RF die 116. Shield 120 adheres to RF die 116 while also reaching the top surface of substrate 112 due to the conforming nature of the epoxy resin. As an alternative, adhesion layer 126 need not be used. In such case there would be a gap between shield 120 and RF die 116. Shield 120 would be attached with adhesive material to package substrate 112. A shield of the same type as shield 120 may also be applied to stacked die system 10 of FIG. 1. In such case the shield such as shield 120 would extend beyond the edge of spacer 20, beyond the edge of RF die 16, and drop down to package substrate 12 between bond pads 50 and 52 and between bond pads 46 and 48. This is shown in FIG. 3.

As an alternative shield 120 could simply be a support mechanism and not function as a shield in cases where shielding is not required. In such case of shield 120 being a support mechanism only, it could be non-conductive. If non-conductive, there would not be a shielding effect to electromagnetic interference (EMI) and thus would not need to be grounded. In such case there would not be a need for wires 148 and 150. This would be applicable to the situation in which stacking the die does not result in the requirement for EMI protection. Such support may be increasing necessary as die are made thinner and thinner. There are currently expectations that die will be 25 microns thick. The processing of the die would be at a much greater thickness, but after the processing, the semiconductor wafer is thinned, then singulated to obtain the die. At these very thin thicknesses the requirement for support on the edges will increase and will also increase the need for the support, shield 120, to be close to the perimeter of the die, die 118, that is being supported, such as within 100 microns of the perimeter. It may be even be advantageous to support even at the perimeter. In order to be certain of doing this, it may even further be advantageous to extend beyond the perimeter of the die that is being supported.

Another significant difference between stacked die system 100 and stacked die system 10 is that RF die 116 is a flip chip having conductive bumps that mate directly to package substrate 112. A benefit of this is that no spacer, such as spacer 20, is required. In the flip chip configuration, the active circuitry is on the bottom surface so is sufficiently removed from shield 120 to avoid the creation of the problems that spacer 20 overcomes. Thus, the thickness of a spacer such as spacer 20 does not add to the height of the total package height. Shield 120 preferably has holes so that subsequent application of a mold compound would result in the mold compound filing the cavity under shield 120. Further, prior to the insertion of the mold compound, a filler may be inserted inside shield 120 that can be conductive. Such a conductive filler would be useful in providing even more EMI shielding. This conductive filler option is available for the flip-chip arrangement like that of FIG. 2.

As for the case of stacked die system 10, stacked die system 100 can be put together using conventional equipment used for die attach. Techniques for obtaining and forming a copper shield such as shield 120 are known to those of ordinary skill in the art.

Shown in FIG. 3 is a stacked die system 11 which is the same as stacked die system 10 with a different shield 29, a different adhesion layer 31 between the shield and digital die 18, the removal of layers 20, 26, and 28, the removal of wires 64 and 66, and the removal of pads 46 and 52. The elements in common have retained their same number designation. Shield 29 is the same shape as shield 120 of FIG. 2. This shows the shielding effect on the sides of die 16. In particular this shields wire 62 from wire 58 on one side and wire 60 from wire 56 on the other side.

Shield 120 of FIG. 2 may be replaced by a shield of the same type as shield 28 of FIG. 1. In such case the shield could simply be coterminous with the edge of RF die 116. In such case the thickness could be reduced to that used for shield 28 of FIG. 1. The material would preferably be copper, but other conductors such as aluminum are candidates. As an alternative, the shield, instead of being preformed and placed on the RF die with an epoxy adhesion layer, may be deposited, using a semiconductor processing technique such as sputtering, onto the backside of RF die 116.

Figure 4:
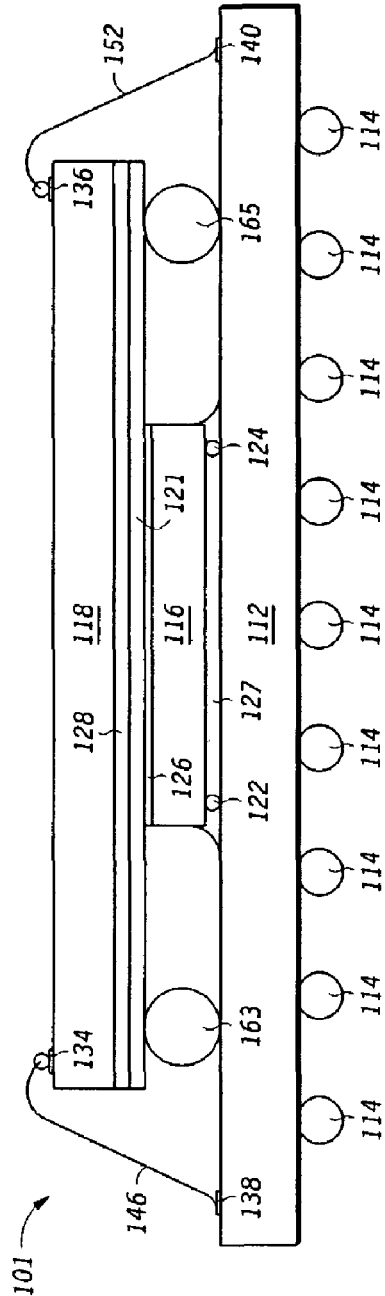
FIG. 4 is a cross section of a stacked die system according to even yet another embodiment of the invention.

Further such a shield as shield 28 used in a flip chip arrangement such as shown in FIG. 2 may be supported by additional means. Shown in FIG. 4 is stacked die system 101 with a shield 121 that replaces shield 120 having such alternative support. Shield 121 is flat and supported by solder balls 163 and 165 that are relatively large. In this cross section only two solder balls 163 and 165 are shown but many more are around the perimeter of shield 121. In this example, die 116 has a thickness of about 0.18 mm, the thickness of adhesion layer 126 is about 0.03 mm, and the height of die 116 above substrate 112 is about 0.06 mm. Thus, solder balls 163 and 165 need to be about 0.18+0.06+0.3, which is about 0.27 mm. It is common for solder balls to be 0.3 mm, which is a very effective size for this purpose. With heating and reformation, a solder ball of 0.03 mm is very effective in making contact across a space of 0.27 mm. Of course the space and solder ball dimensions may be adjusted for optimization of the process and/or the structure. With a plurality of solder balls such as 163 and 165 surrounding RF die 116, there is substantial shielding between wire 146 and die 16 and also there is inherently space for the mold compound to flow between the solder balls 163 and die 116. A benefit of this approach is that the solder balls are formed conveniently in a process flow because balls 163 and 165 can be reflowed at the same time as bumps 122 and 124.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. For example, the package type shown is a ball grid array, but another package type such as quad flat-pack no-lead (QFN) or land grid array (LGA) could be used. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for forming a stacked die system, comprising:
providing a package substrate;
placing a first die over the package substrate, the first die having a first surface with active circuitry;
applying a first epoxy resin over the first die;
placing a conductive shield over the first die and the first epoxy resin after the step of applying the first epoxy resin;
applying a second epoxy resin over the conductive shield after the step of placing the conductive shield;
placing a second die over the conductive shield, the second die having a first surface with active circuitry, wherein the conductive shield is between the first surface of the first die and the first surface of the second die;
forming electrical connections between the active circuitry of the first die and the package substrate;
forming electrical connections between the active circuitry of the second die and the package substrate;
obtaining a wafer having an aluminum coating; and
singulating the wafer to form the conductive shield, wherein the step of obtaining is further characterized by the wafer comprising silicon.

2. The method of claim 1, wherein the active circuitry in one of the first or second die generates RF signals.

3. The method of claim 1, wherein forming the conductive shield over the first die comprises forming the conductive shield over the first die to the package substrate, the conductive field substantially surrounding the electrical connections between the active circuitry of the first die and the package substrate.

4. The method of claim 1, wherein the first die has a second surface opposite the first surface, and wherein placing the first die over the package substrate comprises adhering the second surface to the package substrate.

5. The method of claim 1, further comprising forming a spacer over the first die, wherein the conductive shield is formed over the spacer.

* * * * *